United States Patent
Tskitishvili et al.

(10) Patent No.: US 9,898,570 B2
(45) Date of Patent: Feb. 20, 2018

(54) TRANSPARENT EDITING OF PHYSICAL DATA IN HIERARCHICAL INTEGRATED CIRCUIT DESIGN

(71) Applicant: Synopsys, Inc., Mountain View, CA (US)

(72) Inventors: Karlo Tskitishvili, Santa Clara, CA (US); Jeffrey J. Loescher, Portland, OR (US); Luis D. Guilin, Livermore, CA (US); Paul M. Furnanz, Lake Oswego, OR (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 15/076,372

(22) Filed: Mar. 21, 2016

(65) Prior Publication Data

US 2016/0275228 A1    Sep. 22, 2016

Related U.S. Application Data

(60) Provisional application No. 62/136,375, filed on Mar. 20, 2015.

(51) Int. Cl.
*G06F 17/50*    (2006.01)

(52) U.S. Cl.
CPC ............... *G06F 17/5072* (2013.01)

(58) Field of Classification Search
CPC .................................................. G06F 17/5072
USPC ............................................................ 716/119
See application file for complete search history.

(56) References Cited

U.S. PATENT DOCUMENTS

| | | | | |
|---|---|---|---|---|
| 5,586,319 A | * | 12/1996 | Bell | G06F 17/5045 700/195 |
| 5,598,344 A | * | 1/1997 | Dangelo | G01R 31/31704 714/E11.167 |
| 2011/0107286 A1 | * | 5/2011 | Batterywala | G06F 17/5081 716/122 |

* cited by examiner

*Primary Examiner* — Suresh Memula
(74) *Attorney, Agent, or Firm* — Park, Vaughan, Fleming & Dowler LLP; Laxman Sahasrabuddhe

(57) ABSTRACT

Systems and techniques are described for transparently editing physical data in hierarchical IC designs. Some embodiments allow a user to access objects at any level of the physical hierarchy and to specify a particular editing operation (move, rotate, delete, cut, split, etc.) relative to the top-level block. The embodiments can automatically transform and apply the editing operations in the context of the block where the edited object resides. Systems and techniques for automatic context selection, logical connection analysis, cross hierarchical routing, transparent hierarchical routing, and maintaining physical connectivity across hierarchy boundaries are also described.

15 Claims, 15 Drawing Sheets

Trace a connection from a first circuit object to a second circuit object in the circuit design, wherein the connection passes through at least one physical hierarchy boundary
352

Display a direct line from the first circuit object to the second circuit object in a visual representation of the circuit design
354

FIG. 3C

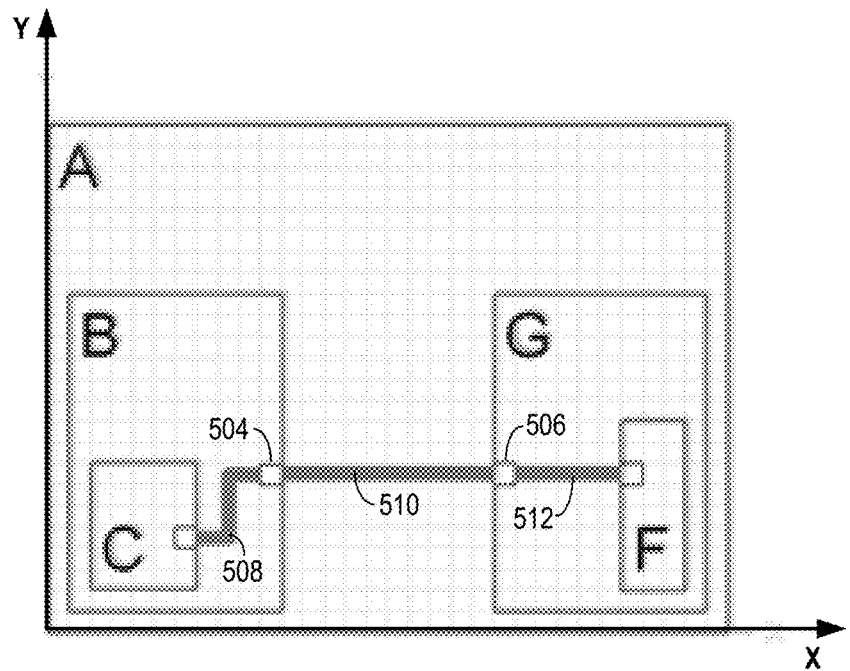

FIG. 5C

```
┌─────────────────────────────────────────────────────┐
│  Trace a logical connection from a first circuit    │
│  object to a second circuit object in the circuit   │
│  design, wherein the logical connection passes      │
│  through at least one physical hierarchy boundary   │
│                        552                          │
└─────────────────────────────────────────────────────┘
                          ↓
┌─────────────────────────────────────────────────────┐
│  Create a physical connection corresponding to the  │
│  logical connection in a physical hierarchy context │
│  that is common to both the first circuit object    │
│  and the second circuit object                      │
│                        554                          │
└─────────────────────────────────────────────────────┘
                          ↓
┌─────────────────────────────────────────────────────┐
│  Push down the physical connection into physical    │
│  hierarchy levels along the physical connection     │
│  route                                              │
│                        556                          │
└─────────────────────────────────────────────────────┘
```

FIG. 5D

TRANSPARENT EDITING OF PHYSICAL DATA IN HIERARCHICAL INTEGRATED CIRCUIT DESIGN

RELATED APPLICATION

This application claims benefit of U.S. Provisional Application Ser. No. 62/136,375, filed on 20 Mar. 2015, by the same inventors, the contents of which are herein incorporated by reference in their entirety for all purposes.

BACKGROUND

Technical Field

This disclosure relates to integrated circuit (IC) design. More specifically, this disclosure relates to transparent editing of physical data in hierarchical IC design.

Related Art

Advances in process technology and an almost unlimited appetite for consumer electronics have fueled a rapid increase in the size and complexity of IC designs. Software tools can be used to perform various operations on IC designs, e.g., creating and editing schematics and layouts, synthesizing, optimizing, and verifying circuit designs, etc. What are needed are user-friendly software tools that enable a circuit designer to create circuit designs that reduce the overall circuit design time and/or improve the overall quality of results (QoR).

SUMMARY

Some embodiments described herein provide circuit design tools for editing objects in a circuit design. Some embodiments can create a second object based on a first object in the circuit design, wherein said creating comprises applying a sequence of one or more geometric transformations to the first object. In some embodiments, the first object is represented in a first coordinate system associated with a lower level in the physical hierarchy, wherein the second object is represented in a second coordinate system associated with a top level in the physical hierarchy, and wherein applying the sequence of one or more geometric transformations transforms a representation of the first object from the first coordinate system to the second coordinate system. Next, the embodiments can apply one or more edits to the second object (e.g., based on user input), thereby obtaining an edited second object. Applying one or more edits to the second object can include, but is not limited to, moving the second object to a new location, rotating the second object, resizing the second object, and creating a new object within the second object. The embodiments can then apply the sequence of one or more geometric transformations in reverse order to the edited second object, thereby obtaining an edited first object. The embodiments can then save the edited first object in the circuit design.

Some embodiments can display a logical connection in a circuit design. Specifically, some embodiments can trace a connection from a first circuit object to a second circuit object in the circuit design, wherein the connection passes through at least one physical hierarchy boundary. Next, the process can display a direct line (e.g., a straight line having an arrow that indicates signal flow direction) from the first circuit object to the second circuit object in a visual representation of the circuit design.

Some embodiments can facilitate cross hierarchical routing. Specifically, some embodiments can receive a cursor location that indicates an end of a partially routed physical connection from a first object to a second object in a circuit design layout. Next, the embodiments can determine a suggested route to extend the partially routed physical connection based on a current physical hierarchy context. The embodiments can then display the suggested route in a visual representation of the circuit design.

Some embodiments can perform transparent hierarchical routing. Specifically, some embodiments can trace a logical connection from a first circuit object to a second circuit object in the circuit design, wherein the logical connection passes through at least one physical hierarchy boundary. Next, the embodiments can create a physical connection corresponding to the logical connection in a physical hierarchy context that is common to both the first circuit object and the second circuit object. The embodiments can then push down the physical connection into the respective physical hierarchy levels along the physical connection route. Specifically, pushing down the physical connection into the respective physical hierarchy levels along the physical connection route can comprise (1) moving transparent gates to be along the physical connection route, (2) creating physical pins on physical hierarchy block boundaries along the physical connection route, (3) partitioning the physical connection at the physical hierarchy boundaries to obtain routing objects, and (4) assigning each routing object to a corresponding net in the corresponding physical hierarchy along the physical connection route.

Some embodiments can maintain physical connectivity across hierarchical boundaries. Specifically, some embodiments can determine that a first circuit object has a physical connection with a second circuit object, wherein the physical connection crosses at least one physical hierarchy boundary. Next, the embodiments can receive a request to apply a first editing operation to the first circuit object. The embodiments can then determine a second editing operation based on the first editing operation. Next, the embodiments can apply the second editing operation to the second circuit object so that the physical connection between the first circuit object and the second circuit object is maintained across the at least one physical hierarchy boundary.

BRIEF DESCRIPTION OF THE FIGURES

FIG. 3C illustrates a process for displaying a logical connection in a circuit design in accordance with some embodiments described herein.

FIGS. 5A-5C illustrate transparent hierarchical routing in accordance with some embodiments described herein.

FIG. 5D illustrates a process for transparent hierarchical routing in accordance with some embodiments described herein.

DETAILED DESCRIPTION

Figure 1A:
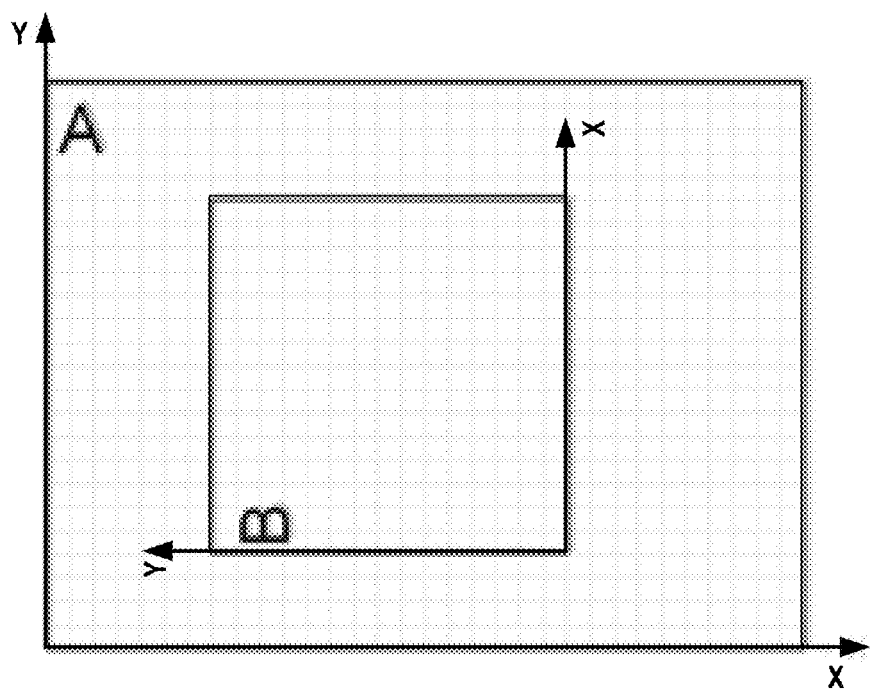
FIGS. 1A-1C illustrate blocks in the IC design hierarchy in accordance with some embodiments described herein.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Overview of Circuit Design

Circuit design software tools can be used to create a circuit design. Once the circuit design is finalized, it can undergo fabrication, packaging, and assembly to produce integrated circuit chips. A circuit design flow can include multiple steps, and each step can involve using one or more circuit design software tools. Some examples of circuit design steps and the associated software tools are described below. These examples are for illustrative purposes only and are not intended to limit the embodiments to the forms disclosed.

Some circuit design software tools enable circuit designers to describe the functionality that the circuit designers want to implement. These tools also enable circuit designers to perform what-if planning to refine functionality, check costs, etc. During logic design and functional verification, the HDL (hardware description language), e.g., SystemVerilog, code can be written and the design can be checked for functional accuracy, e.g., the design can be checked to ensure that it produces the correct outputs.

During synthesis and design for test, the HDL code can be translated to a netlist using one or more circuit design software tools. Further, the netlist can be optimized for the target technology, and tests can be designed and implemented to check the finished chips. During netlist verification, the netlist can be checked for compliance with timing constraints and for correspondence with the HDL code.

During design planning, an overall floorplan for the chip can be constructed and analyzed for timing and top-level routing. During physical implementation, circuit elements can be positioned in the layout and can be electrically coupled. Some embodiments described herein provide software tools that can be used during design planning. Specifically, some embodiments described herein enable transparent editing of physical data in hierarchical integrated circuit design.

During analysis and extraction, the circuit's functionality can be verified at a transistor level and parasitics can be extracted. During physical verification, the design can be checked to ensure correctness for manufacturing, electrical issues, lithographic issues, and circuitry.

During resolution enhancement, geometric manipulations can be performed on the layout to improve manufacturability of the design. During mask data preparation, the design can be "taped-out" to produce masks which are used during fabrication.

Overview of Circuit Design Editing

A top-level IC design is typically partitioned into physical hierarchies or blocks in much the same way that a neighborhood can be divided into many blocks based on the neighborhood's streets. Within each block, many structures can be present. In keeping with the analogy, the structures within a neighborhood could include houses, detached garages, driveways, swimming pools, backyard gardens, and the like. Analogously, in an IC design, each block can include simple structures such as transistors, capacitors, conductors, open areas, etc., and also other structures such as logic gates that can themselves include multiple simple structures (e.g., a logic gate can include multiple transistors). These structures are described by data that is stored in a non-transistory computer-readable storage medium. For example, when the software tool is executing, the data can be stored in physical memory, and the final data can be written to disk for storage. The data for each block of an IC design typically contains large numbers of logic gates and connecting shapes (e.g., wires or conductors that can be used to electrically connect an output pin of one gate with an input pin of another gate). The structures and shapes (e.g., blocks, conductors, etc.) can be associated with physical coordinates expressed in a Cartesian (X,Y) plane. When the IC design is hierarchical, each block can have its own coordinate system. The data for the circuit design is also hierarchical, i.e., the data for the entire IC design can be thought of as a set of data portions, wherein each data portion represents that data within a block in the top-level IC design.

When it is time to create a layout (or plot plan), the data within each block may be processed independently or simultaneously within the context of their parent block's hierarchy. A spectrum of choices are available for editing IC design data. At one extreme in the spectrum is "flat editing" where the data of each block is fully instantiated within the top-level IC design as if the IC design did not have any hierarchy in the first place. Flat editing is very data intensive and is thus very slow and requires large amounts of computer resources.

Simultaneous processing of different blocks is typically disfavored by IC layout designers, who are responsible for making sure that each structure in a block is properly positioned and that proper functionality will be achieved when the IC design is complete.

IC layout designers often need to create and manipulate data across multiple levels of blocks in the physical hierarchy. In existing software tools, this requires them to spend significant effort navigating through the various blocks in their IC design and managing the consistency of the changes across the various blocks.

Conventional software tools facilitate dealing with physical hierarchy by using a technique called Edit-In-Place (EIP). In this technique, the user is able to pick a sub-block for editing (the selected sub-block can be referred to as the "EIP block") and see its content within the context of the parent hierarchy. However, EIP does not let the user to operate on objects outside the boundary of the current EIP block. Moreover all object coordinates are relative to the current EIP block, and thus require manual translation when something has to be modified relative to objects in different hierarchies. For these reasons, EIP is poorly adapted to deal with issues that arise when dealing with objects that cross hierarchical boundaries.

Overview of Transparent Editing of Circuit Design Data

Some embodiments described herein provide techniques and systems for transparently creating and editing shapes at the proper level of the physical hierarchy. In this disclosure, terms such as "transparent," "transparency," and other similar terms, when used in the context of editing IC designs, mean that user can access objects at any level of the physical hierarchy and can specify a particular editing operation (move, rotate, delete, cut, split, etc.) relative to the top-level block. The system (e.g., the software tool executing on a suitable hardware computing platform) automatically transforms and applies the operation to the block where the edited object resides.

Some embodiments include a data structure for temporary storage of edited objects, which is referred to as a sandbox. The data structure can be stored in computer memory that is accessible to a processor, and the editing operations can be performed on this data structure by the processor. Specifically, the software tools can perform geometric transformations of physical shapes in the sandbox, and the sandbox allows the creation and editing of these shapes using the top-level coordinate system with no additional work on the part of the user.

Some embodiments provide techniques and systems for automatically selecting the proper context (e.g., the appropriate physical hierarchy level) for newly created objects and constraining the edit operations within the object hierarchy scope, based on the location or objects related to the objects being manipulated.

Some embodiments allow physical connectivity to be generated in a simple flat manner. The block boundaries do not limit the connectivity and physical connections can be maintained across the hierarchy when manipulating objects that interact with the boundary of a physical hierarchy.

Some embodiments provide techniques and systems for analyzing logical connections (tracing) between gates and/or blocks of different hierarchies and defining a transparent (or flat) net that includes the set of points to be physically connected across the physical hierarchy. Those points are used for creating physical cross hierarchical connections referred as routes. The routes could be created in each block independently or they could be created at the top level and then pushed into the corresponding blocks. When pushed into the blocks, the routes are sliced and assigned to nets within each block as appropriate, and the physical connection points (which are referred to as pins) are added or updated on the boundaries of each hierarchy block.

Together, these features enable transparent hierarchy editing that lets the user edit shapes within differing levels of physical hierarchy as though the design hierarchy had been completely flattened. In reality however, the physical hierarchy has not been flattened, i.e., most of the circuit design data is not instantiated within the top-level IC design. Some embodiments only instantiate the data for the blocks that are required for performing the editing operation; the data for other blocks is not instantiated. In this manner, embodiments described herein provide the benefits of flat editing (e.g., ease of use etc.) without suffering from the drawbacks (e.g., without requiring large amounts of computer resources).

The following conventions and notations are used in this disclosure in reference to the figures. All depicted objects lie within the parent block's design boundary unless noted otherwise. All coordinates are expressed in a Cartesian plane. All points are shown as a set of two numbers within curly braces, i.e., {x y}. All rectangles are shown as set of two points: low left and upper right corner, i.e., {{x1 y1} {x2 y2}}. All names without the forward slash symbol (i.e., "/") represent the object name within the corresponding parent hierarchy. All names containing forward slashes represent full hierarchical name of an object, e.g., in the name "A/B/C," "A" represents a top-level block, "B" represents an intermediate-level block, and "C" is the bottom-level object (this is the object that is being referred to).

In IC physical design, each level of the physical hierarchy typically has its own coordinate system based on the Cartesian plane. The plane is labeled with X- and Y-axes, and an {X Y} coordinate pair specifies a unique point in the level.

Transparent Editing of Physical Data in Hierarchical IC Design

As we create multiple levels of the physical hierarchy, an instance of a reference physical block is placed at a point in the parent coordinate system, and has an orientation (rotation) that can be applied to it as well. Because of this, there is a need to transform coordinates from the lower-level block into the coordinate system of the higher-level block. This is a long-standing concept in IC physical design and in general for anything hierarchical with physical extent.

Figure 1B:
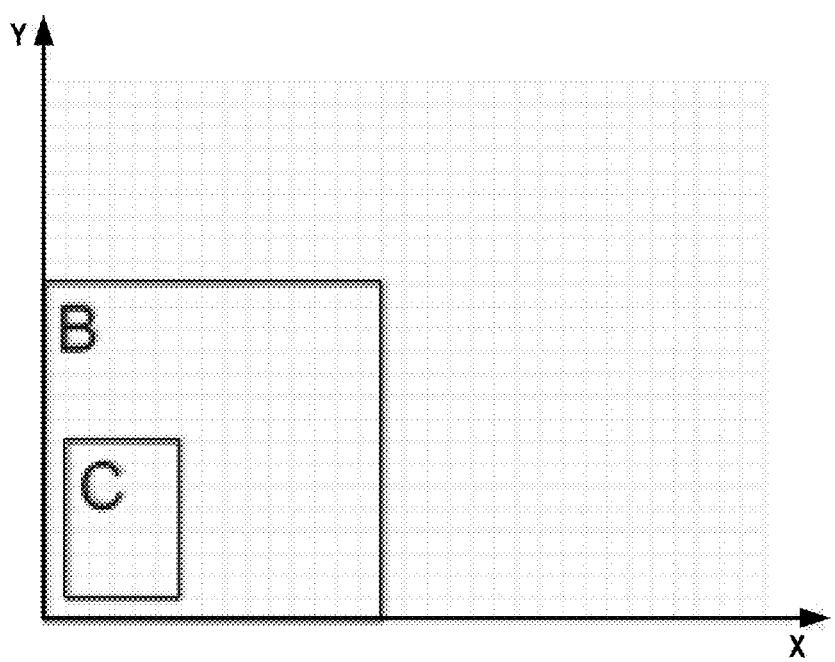
Figure 1C:
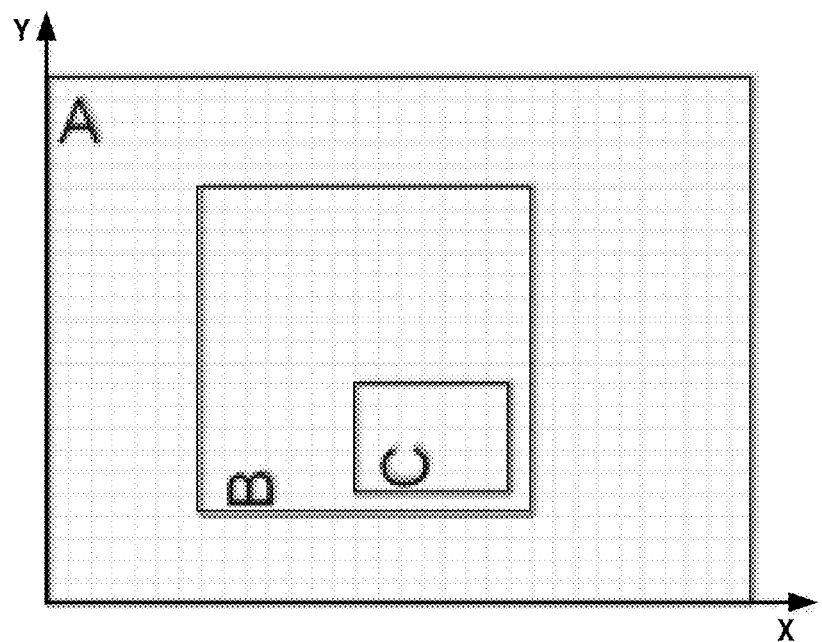

FIGS. 1A-1C illustrate blocks in the IC design hierarchy in accordance with some embodiments described herein. In FIG. 1A, top-level block "A" of size {32 24} contains an instance if block "B" {{7 4} {22 19}} rotated 90 degrees counterclockwise. The size of block "B" {15 15} (the dimensions can be determined from the two corners of block "B": 22−7=15 and 19−4=15). The X- and Y-axes of blocks "A" and "B" are illustrated in FIG. 1A. In FIG. 1B, block "B" with size {15 15} contains object "C" (which itself could be a block at a lower hierarchy level) with coordinates {{1 1} {6 8}}. If the contents of block "B" are instantiated within top block "A" we would get the situation depicted in FIG. 1C. Such a hierarchy is called unfolded physical hierarchy or virtually flat hierarchy.

When there are multiple levels of physical hierarchy, geometric transformations (or "transforms" for short) must be concatenated for use with lower-level physical data. In the example shown in FIGS. 1A-1C, the transforms (e.g., translation, rotation, etc.) for the instance of "B" must be concatenated with the transforms for the instance of "C" in order to construct a transform that can be used to translate physical coordinates in the coordinate system for "C" into the coordinate system for the top design "A." As a result of the transformation, the coordinates for object "C" will be {{14 5} {21 9}}. These coordinates can then be used by a graphical user interface (GUI) of a circuit design editing tool to draw the data on the screen as depicted in FIG. 1C.

As mentioned above, the conventional technique to facilitate dealing with physical hierarchy is the so-called Edit-In-Place (EIP) methodology. In this methodology, the user is able to select a block or a sub-block for editing and see its content within the context of parent hierarchy. However EIP does not let the user to operate objects outside the boundary of current EIP block. Moreover, all object coordinates are relative to current EIP block and thus require manual translation when something has to be modified relative to objects in different hierarchies. The following paragraphs explain, among other things, how the virtual flat editing concept solves the issues that occur when dealing with objects cross hierarchically.

Sandbox Infrastructure

Some embodiments feature a "sandbox infrastructure" (or "sandbox" for short), which can include a data structure for temporary storage of edited objects, and an application programming interface (API) to manipulate the objects in the data structure. In some embodiments, the sandbox can be the core infrastructure for editing with transparent hierarchy. The sandbox (i.e., the data structure for temporary storage of edited objects and the accompanying API) can be used by a software tool for performing geometric transformations of physical shapes in an IC design, and the sandbox can allow the creation and editing of these shapes using the top-level coordinate system with no additional work on the part of the user.

Specifically, when a design object is chosen for editing, the design object can be placed in the sandbox storage data structure (which may be located in physical memory in a computer system). At the moment of loading the object into the storage, the sandbox can transform the coordinates of the object from the corresponding level of the physical hierarchy into the top-level physical hierarchy coordinate system. From this point onwards, the object becomes a sandbox object, and the sandbox object can have the following pieces of information associated with it: (1) a pointer to the original object in the IC design, (2) a pointer to an instance of a block to which the original object (and therefore the sandbox object) belongs, and (3) a cumulative transformation from the hierarchical level of the original object to the top hierarchical level.

Once the sandbox object has been created, all of the editing operations are performed (i.e., through the sandbox API) on the sandbox object in the top-level coordinate system. Upon completion of the editing operations on the sandbox object, the coordinates of the sandbox object undergo a reverse cumulative transformation (e.g., by applying the cumulative transformation associated with the sandbox object in reverse order) from the top-level coordinate system to the hierarchy level where the original object resided. Then, the modified object (i.e., the resulting object after applying the reverse cumulative transformation to the modified sandbox object) can be saved within the corresponding block. In this manner, each object in the sandbox may have its own physical context and therefore its own separate transformation when applying changes, but each sandbox object can be manipulated by the user with a single simple transformation relative to the top level coordinate space.

Figure 2A:
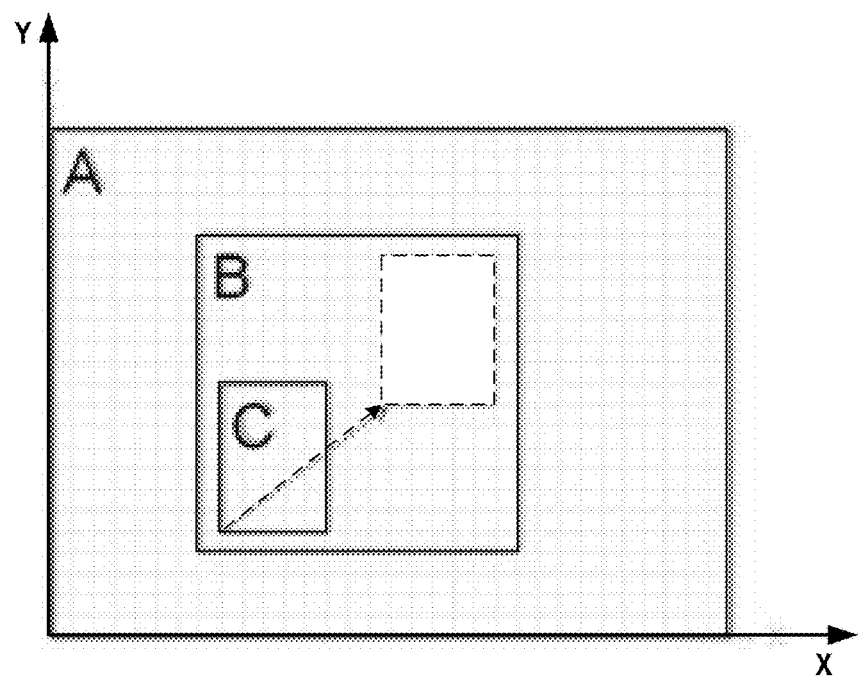
FIGS. 2A-2G illustrate how a sandbox can be used for transparent editing in accordance with some embodiments described herein.
Figure 2B:
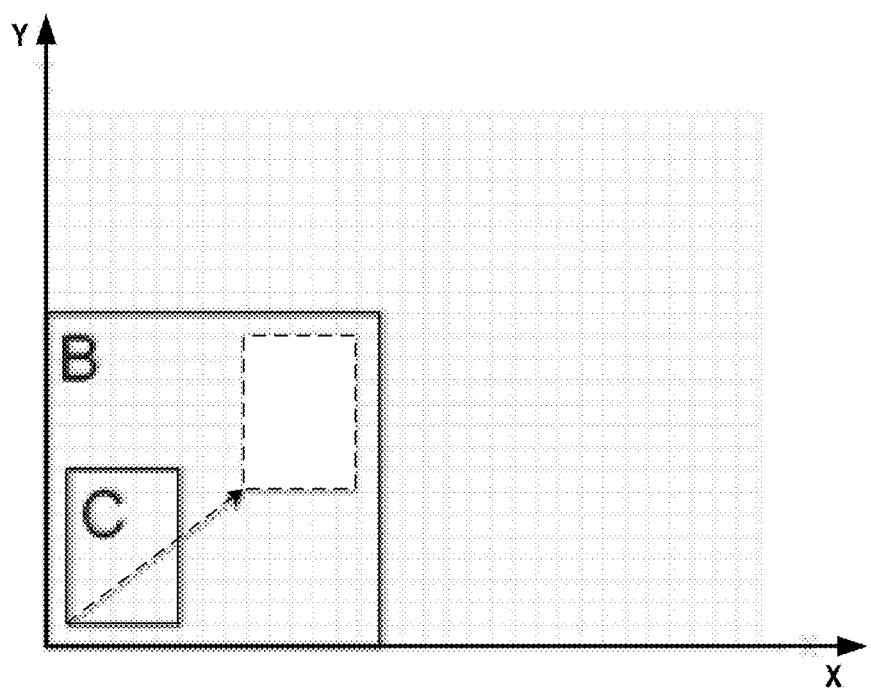

FIGS. 2A-2G illustrate how a sandbox can be used for transparent editing in accordance with some embodiments described herein. In FIG. 2A, object "C" with coordinates {{1 1} {6 8}} in the coordinate space of block "B" can be loaded into the sandbox as shape {{8 5} {13 12}} in terms of the coordinate space of top-level design "A." The user may move object "C" (the movement corresponds to applying a delta of {8 6} to the two corners of object "C") to the new location that is shown by a dashed rectangle in FIG. 2A. After applying delta {8 6}, the object "C" rectangle becomes {{16 11} {21 18}} in terms of the coordinate space of top-level design "A." After reverse transforming the new coordinates of object "C" into the block "B" coordinate space, object "C" is represented as rectangle {{9 7} {14 14}} in block "B" coordinate space, which is shown in FIG. 2B. Note that, when the circuit design data is saved, object "C" is saved in terms of the coordinate space of block "B," i.e., as rectangle {{9 7} {14 14}}, within the data portion corresponding to block "B." However, when the user moved object "C" using the GUI, the software tool manipulated the representation in the sandbox where object "C" was represented in terms of the coordinate space of top-level design "A," i.e., as rectangle {{16 11} {21 18}}.

Figure 2C:
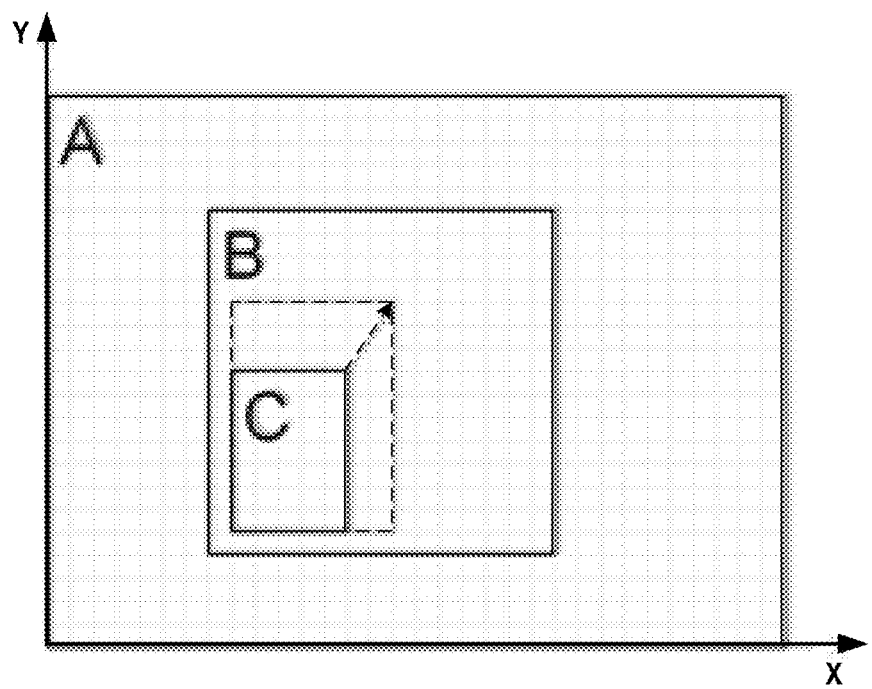
Figure 2D:
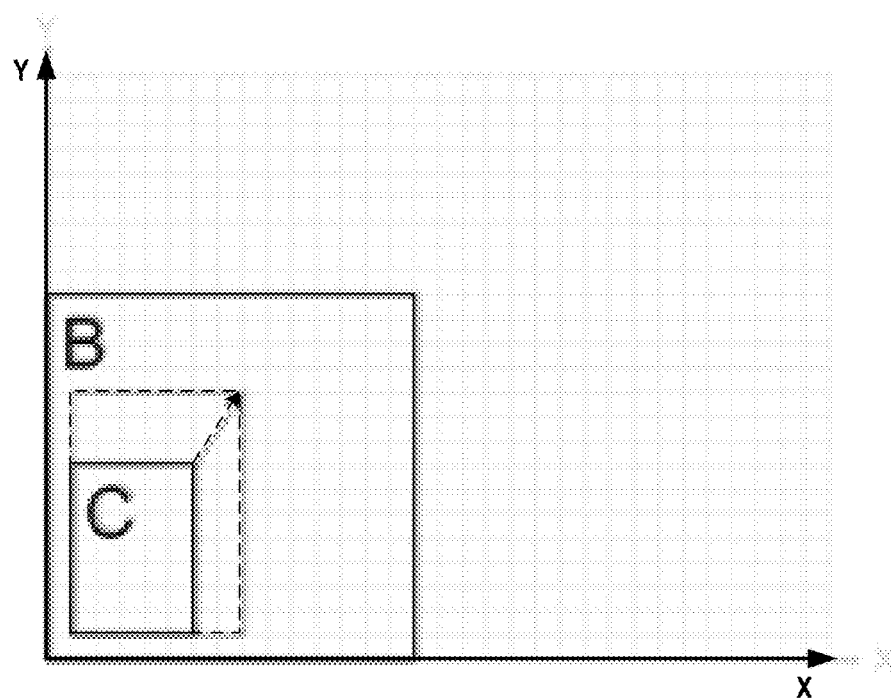

In FIG. 2C, object "C" with coordinates {{1 1} {6 8}} in block "B" coordinate space can be loaded into the sandbox as shape {{8 5} {13 12}} in terms of the top design "A" coordinate space. Then, as shown in FIG. 2C, a user may resize object "C," which corresponds to applying a delta of {2 3} to its upper right corner, thereby resulting in rectangle {{8 5} {15 15}}. After reverse transforming the new coordinates of object "C" into the block "B" coordinate space, the new shape can be represented as rectangle {{1 1} {8 11}}, which is depicted in FIG. 2D.

Figure 2E:
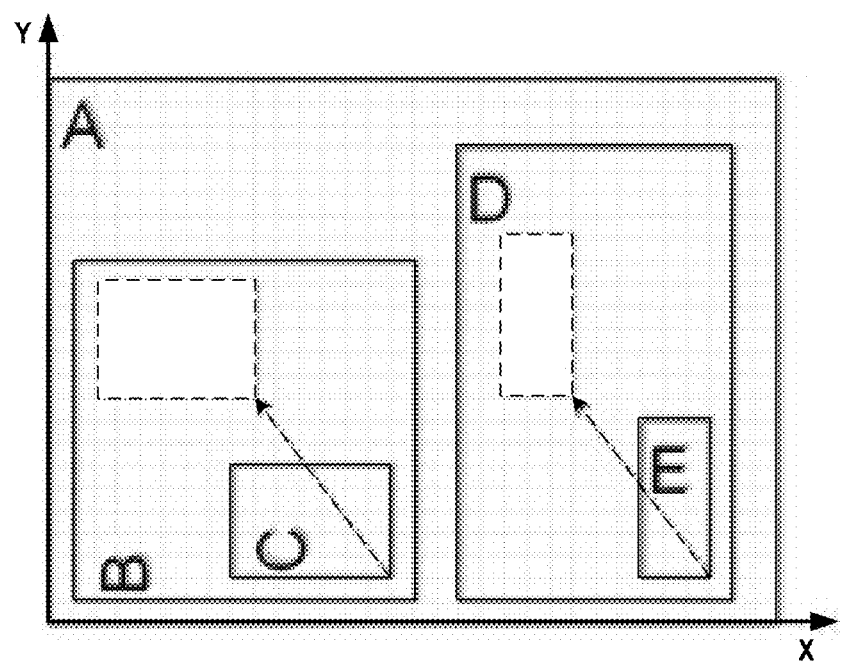

By allowing instances in multiple physical contexts to be transformed with a single operation this also allows powerful multi-block editing operations such as in FIG. 2E, in which a single transform at the top level is applied to instances contained within two different blocks. In the example shown in FIG. 2E, blocks "C" and "E" are both selected and start out aligned on their bottom edges. The user then moves them with a single vector (the two parallel arrows that move blocks "C" and "E" in FIG. 2E) relative to the top block, and the circuit design editing system (which uses the sandbox infrastructure) automatically translates the transformation into the appropriate block context when applying the changes.

The sandbox infrastructure can generally be used for any operation. Specifically, besides object modification, the sandbox infrastructure can be used for object creation. In order to create an object in a "virtually flat block hierarchy," the user has to specify two things. First, the user has to specify the parent block or context where the object has to be created (context selection for object creation is described below). Second, the user has to specify the object shape in terms of top design coordinate space. Upon completion of object creation, the object shape coordinates can be transformed by the sandbox infrastructure from the top-level coordinate space to the coordinate space of the block where the object resides. Finally, the modified object (i.e., the newly created object in this example) is can be saved within the context of the block in which it was created.

Figure 2F:
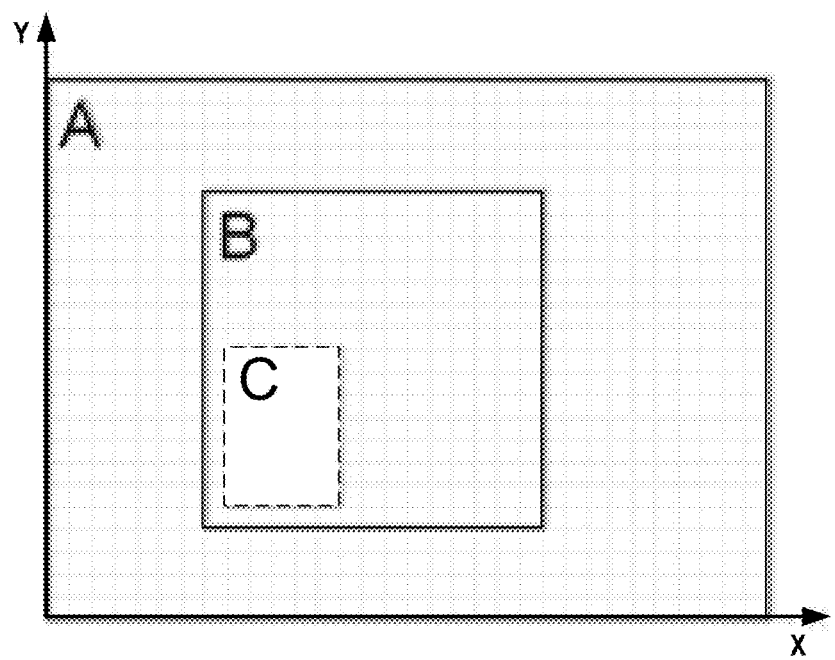
Figure 2G:
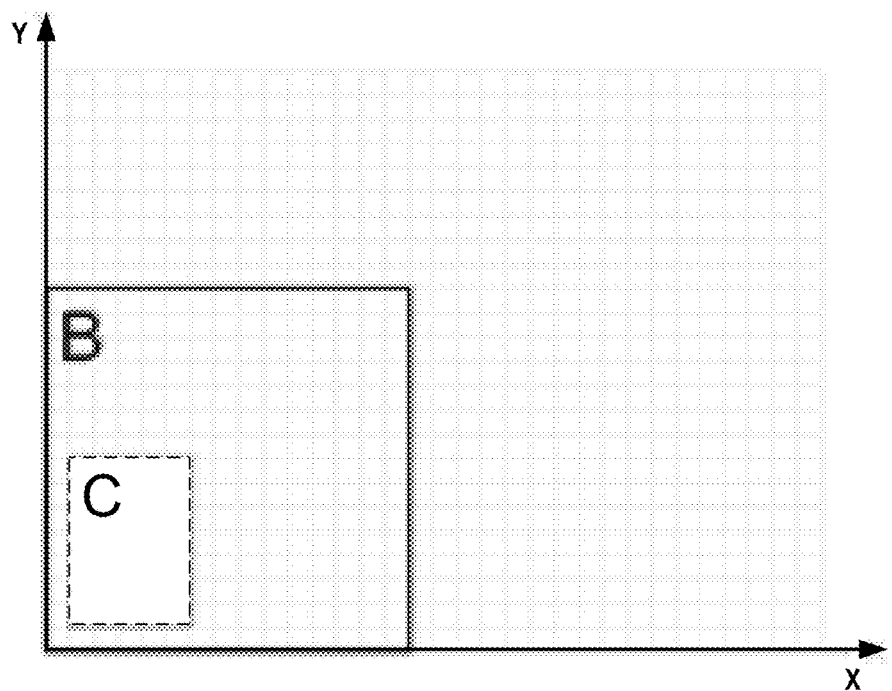

In FIG. 2F, newly created object "C" has coordinates {{8 5} {13 12} in the sandbox infrastructure (note that these coordinates are in terms of the top-level design "A" coordinate space). Before saving the newly created object "C" as part of the circuit design data, the representation of object "C" in the sandbox is transformed into the parent block "B" coordinate space. Specifically, in the parent block "B" coordinate space, object "C" is represented as rectangle {{1 1} {6 8}} as depicted in FIG. 2G. This representation, i.e., rectangle {{1 1} {6 8}}, can then be stored as part of the circuit design data.

Figure 2H:
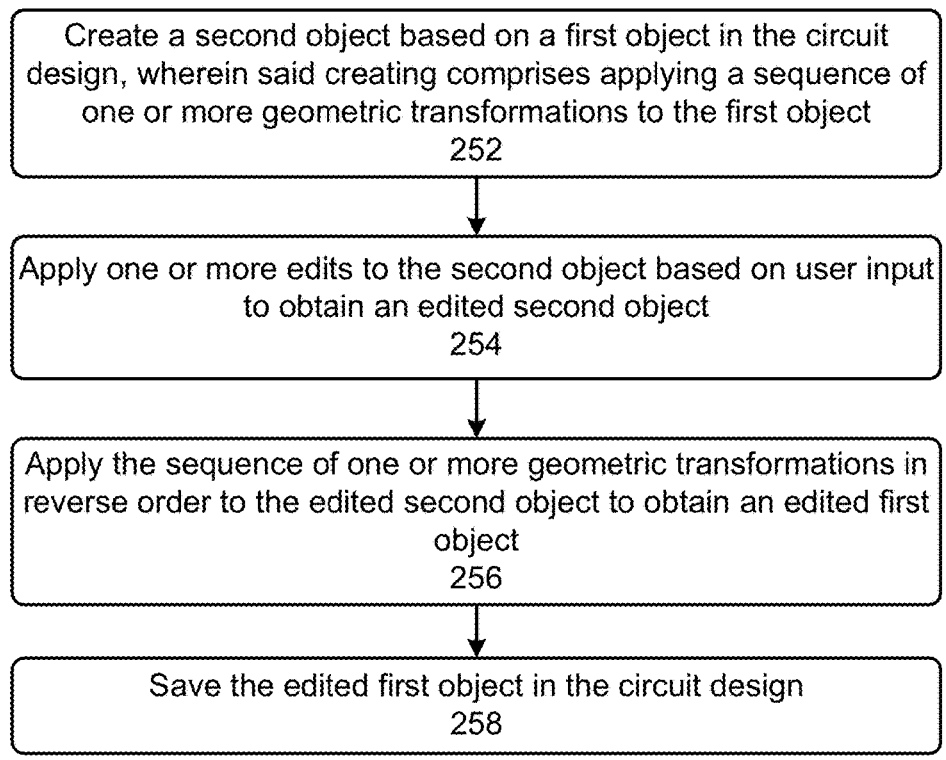
FIG. 2H illustrates a process for editing an object in a circuit design that has multiple physical hierarchy levels in accordance with some embodiments described herein.

FIG. 2H illustrates a process for editing an object in a circuit design that has multiple physical hierarchy levels in accordance with some embodiments described herein. The process can begin by creating a second object based on a first object in the circuit design, wherein said creating comprises applying a sequence of one or more geometric transformations to the first object (operation 252). In this disclosure, the term "object" generally refers to any editable circuit element. Therefore, block "B" and object "C" in FIGS. 2A-2G are both "objects" under this definition. The term "second object" can refer to a sandbox object, i.e., an object that is loaded or created in the sandbox infrastructure. The geometric transformations can correspond to the physical hierarchy levels as explained above in reference to the sandbox infrastructure.

Next, the process can apply one or more edits to the second object (e.g., based on user input) to obtain an edited second object (operation 254). The edits can include, but are not limited to, translation (see e.g., FIG. 2A), resizing (see e.g., FIG. 2C), new object creation (see e.g., FIG. 2F), rotation, etc. The process can then apply the sequence of one or more geometric transformations in reverse order to the edited second object to obtain an edited first object (operation 256). As explained above, the sequence of one or more geometric transformations can be stored in the sandbox infrastructure, and can be associated with the sandbox object. FIGS. 2A-2G and the associated text provide multiple examples of how the sequence of one or more geometric transformations can be applied in reverse order to the edited second object to obtain an edited first object. Next, the process can save the edited first object in the circuit design (operation 258).

Context Selection and Hierarchy Scope

Some embodiments feature techniques and systems for selecting proper context (physical hierarchy level) for creating objects. Specifically, some embodiments provide two distinct ways to specify the context: textual and interactive.

In textual form of input, the user can enter the full object name which includes the names of every parent up to the top of the hierarchy. For example, the full name for object "C" in FIG. 1C is "A/B/C" (assuming that the forward slash symbol is used as the hierarchy delimiter), and likewise the full name for block "B" is "A/B."

In interactive form of input, the user can place a mouse cursor within the object shape and click to select the object shape for an editing operation. If multiple objects overlap at the location of the cursor, then a set of priority rules can be used to select the object for determining context. Specifically, the following priority rules can be applied: (1) select the object whose edge is nearest to the cursor location, and (2) if several object edges are at the same distance from the cursor, then select the object that is located deeper in the hierarchy.

Some embodiments can provide a visual feedback for objects to be selected on a mouse click (this capability is referred to as "preview"). Specifically, as a mouse (or generally any pointing mechanism) hovers over the object to be selected, the object's boundary can be drawn with a dotted pattern, and a tooltip popup can be used in the corner of the window with brief information about the object, such as object type, object name, parent name and level.

There can always be situations where all things are equal and the object that was automatically selected by the system based on the cursor location is not the one desired by the user. In these situations, some embodiments can allow the user to cycle through all overlapping objects under the cursor. However, some embodiments extend this familiar paradigm in a novel way. Specifically, the cycling between all of the objects that are potential candidates for selection is now allowed through objects in different contexts. To engage the cycling functionality, in some embodiments the user can activate the accelerator key (which can be defined based on the user's preferences). The order of the objects that are cycled through can be determined based on a set of priority rules, e.g., those that were described above. Once the desired object has been selected, the user can use the pointing mechanism to confirm the selection.

Some embodiments described herein can constrain edit operations performed on the object based on the hierarchy scope that the object belongs to. The hierarchy scope can include all object neighbors, the parent block boundary, and all child hierarchies of the parent block. When an object is being edited (i.e., moved, resized, etc.), the object shape has to stay within the boundary of the parent block. Some embodiments can ensure that an edit operation does not cause the object to move outside the boundary of the parent block. The edited object snapping (this feature is also known as the process of sticking objects to other objects during move/resize) is also limited to objects within the same hierarchy scope.

Logical Connection Analysis

In integrated circuit physical design, circuit elements (e.g., logic gates) are connected to other circuit elements. The logical connection between circuit elements is called a net, and it is usually shown in a physical layout as an arrow between the circuit elements. The physical connection between two circuit elements is called a route. A route comprises a set of rectangular shapes which overlap with each other, and the connecting points between the circuit elements are called pins. A net can connect pins inside a block and outside the block, which is explained below. Some embodiments described herein can analyze logical connections between circuit elements (logic gates, blocks, etc.) in different hierarchies.

Figure 3A:
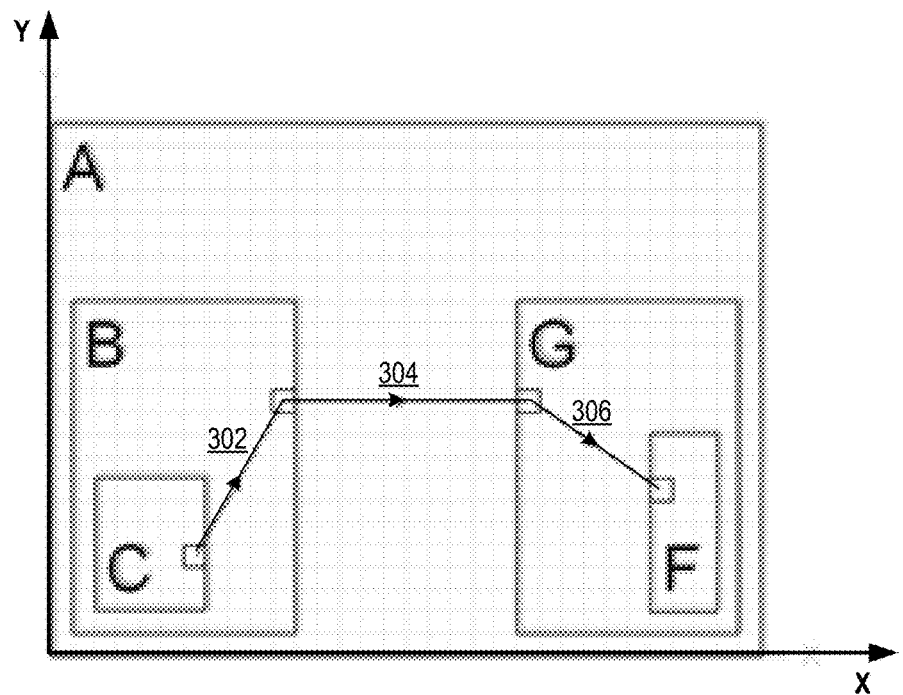
FIG. 3A illustrates a connection across multiple hierarchies in accordance with some embodiments described herein.

FIG. 3A illustrates a connection across multiple hierarchies in accordance with some embodiments described herein. In FIG. 3A, there are three net connections displayed across three hierarchies, and each net connection is shown as a line with an arrow in the middle of the line. Net 302 is an internal net in block "B" that connects a pin of object "C" with a pin of block "B." Net 304 is an external net with respect to blocks "B" and "G," and connects a pin of block "B" with a pin of block "G." Net 306 is an internal net in block "G" that connects a pin of block "G" with a pin of object "F." Nets 302, 304, and 306 taken together represent a path of a signal from object "C" to object "F." The arrows represent the signal direction.

The process of finding a path, such as the one shown in FIG. 3A from a pin in object "C" to a pin in object "F," is called tracing. A tracing operation can be performed between any two pins in the circuit design. For a given object pin, the tracing process can look at all other pins that are connected to it by a net. For each block pin the process can take into consideration two types of nets: internal and external.

Figure 3B:
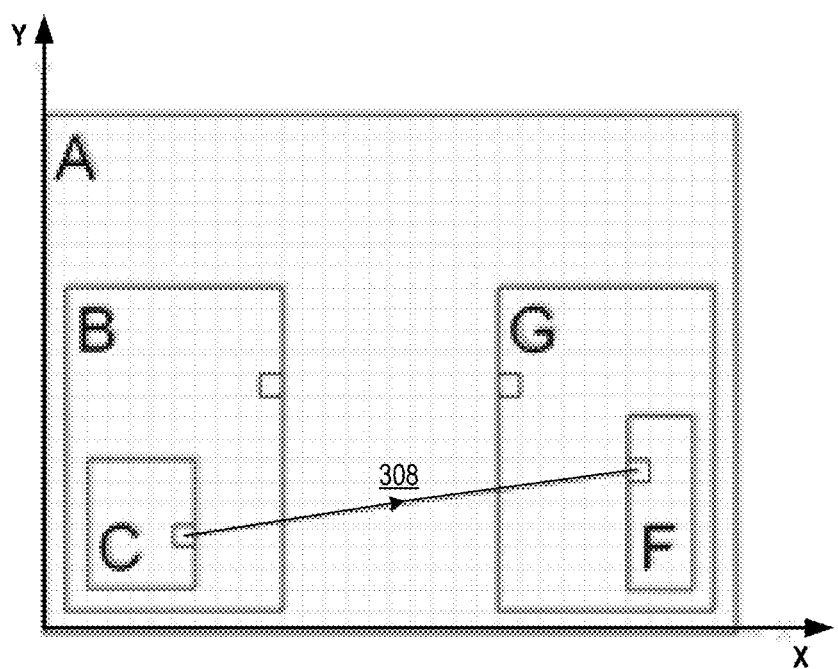
FIG. 3B illustrates a net connection that skips hierarchies in accordance with some embodiments described herein.

Some embodiments described herein feature a process for tracing a net that allows a user to skip hierarchies and see the signal destination across multiple levels of hierarchy. FIG. 3B illustrates a net connection that skips hierarchies in accordance with some embodiments described herein. In FIG. 3B, the same two object pins have been selected for tracing as in FIG. 3A, namely the pins of objects "C" and "F." In other words, some embodiments described herein create an alternate definition for the net. This alternate definition can be referred to as the "transparent net" because it skips block boundaries. For example, transparent net 308 connects pin of object "C" in block "B" with a pin of object "F" in block "G." A "transparent net" can be used for creation of the physical connection between two pins, and can be automatically mapped onto the actual hierarchical net (i.e., transparent net 308 in FIG. 3B can be automatically mapped to nets 302, 304, and 306 shown in FIG. 3A).

FIG. 3C illustrates a process for displaying a logical connection in a circuit design in accordance with some embodiments described herein. The process can begin by tracing a connection from a first circuit object to a second circuit object in the circuit design, wherein the connection passes through at least one physical hierarchy boundary (operation 352). Next, the process can display a direct line (e.g., a straight line having an arrow that indicates signal flow direction—for example see transparent net 308 in FIG.

3B) from the first circuit object to the second circuit object in a visual representation of the circuit design (operation 354).

Cross Hierarchical Routing

Some embodiments can create physical connections at multiple levels of hierarchy. This feature can be referred to as "cross hierarchical routing." Upon completion of logical net connections analysis, a user may want to connect circuit elements in the circuit design with one another using physical connections or routes. The physical path (i.e., the route that the wire takes through the circuit design) has to follow the logical net connections.

Figure 4A:
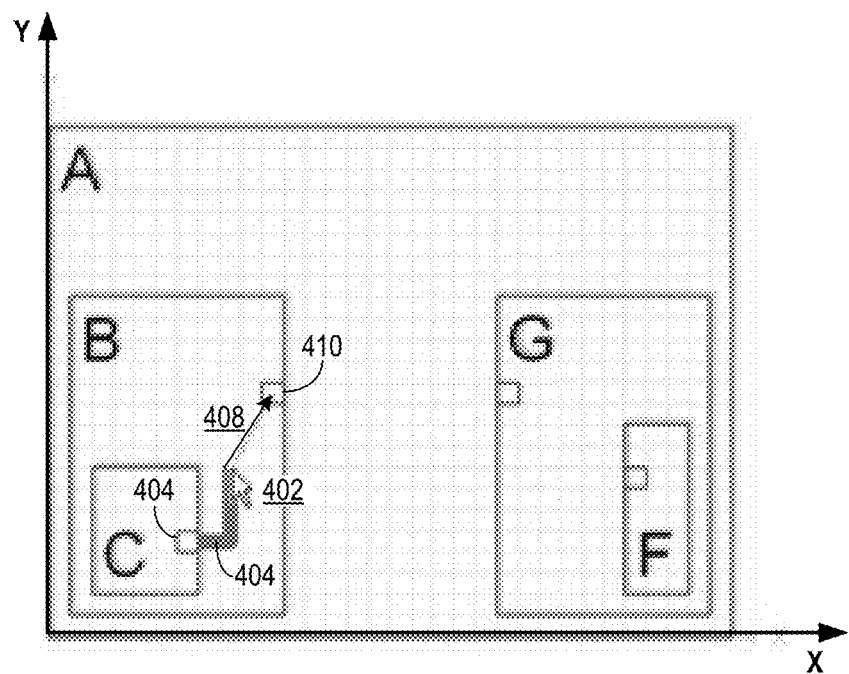
FIGS. 4A-4D illustrate cross hierarchical routing in accordance with some embodiments described herein.

FIGS. 4A-4D illustrate cross hierarchical routing in accordance with some embodiments described herein. As described above, some embodiments can select a context based on a cursor location while creating the route. As shown in FIG. 4A, a user can select a pin of object "C." Note that object "C" resides within block "B." Then, the user can use the GUI to manually create the route by laying down the route within block "B" as depicted in FIG. 4A. All routes created by the user are associated with a logical net that connects the pin of object "C" with the pin of block "B."

Some embodiments can display a nearest unconnected pin from the current position of the mouse cursor (or generally the current position of a pointing mechanism) during manual route creation. Specifically, the visual object that is used for displaying the nearest unconnected pin can be referred to as "open flylines." For example, in FIG. 4A, the position of mouse cursor 402 is at the top of thick line 404 which represents the route that has been started from pin 406 of object "C." Open flyline 408 points to nearest unconnected pin 410 of block "B."

Figure 4B:
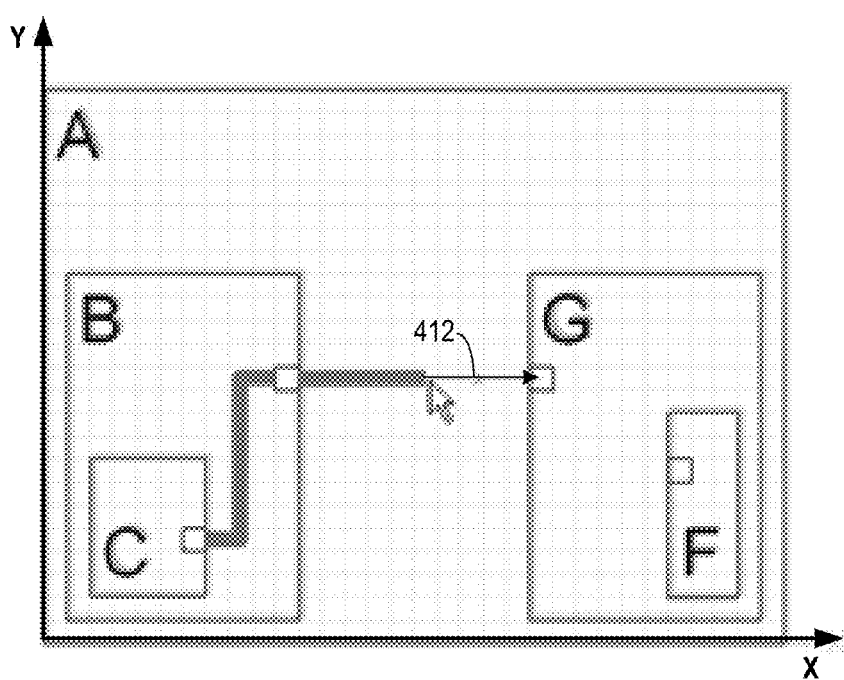

Upon completion of routing within block "B," user can continue routing between blocks "B" and "G" as depicted in FIG. 4B. In this phase, the routes are created at the top level, i.e., within the hierarchy level of design "A." Open flyline 412 can be displayed from the tip of the route created so far to the nearest unconnected pin of block "G." Open flyline 412 indicates the direction where the route should go, thereby helping the user to easily create the route.

Note that the system can automatically select the correct context based on the cursor location. Specifically, when the user creates a route that spans across multiple hierarchy levels, the system can automatically select the appropriate context as the user moves the cursor along the path of the route. As shown in FIGS. 4A and 4B, the system automatically selected the context of block "B" when the user created the route from the pin of object "C" to the pin of block "B," and then the system automatically selected the top level context when the user started to create the route from the pin of block "B" to the pin of block "G."

These embodiments are significantly more user friendly than conventional tools for editing circuit designs. In conventional tools, a user would have had to push into block "B" using Edit-In-Place, route the connection from "C" to "B," then pop out to the top level to route between "B" and "G," and then push into "G" to route from "G" to "F." In contrast to this cumbersome use case, embodiments described herein do not require the user to manually navigate through the physical hierarchy while creating the route. Instead, in embodiments described herein, the user can create routes at different levels in the hierarchy directly from the top level context, with the application taking care of the detailed transformations and putting the objects in the appropriate physical context by using the automatic context selection process and by using the sandbox infrastructure that were described above.

In integrated circuit physical design, block pins have dual presentation as they connect with two nets: internal and external. Thus they have a shape which is presented at block level and same shape presented at the parent hierarchy level. This allows effectively pick the routing context using the cycling method described above. Specifically, as the mouse cursor hovers over the block pin, the internal pin shape may be initially picked for selection which is indicated by a tooltip graphical object in the GUI. As user hits the key associated with the cycling function, the external pin shape may be picked and the associated information may be displayed. At that point, the user may click the mouse, thereby confirming the selection of the external shape which, in turn, starts routing the connection at the upper level.

Figure 4C:
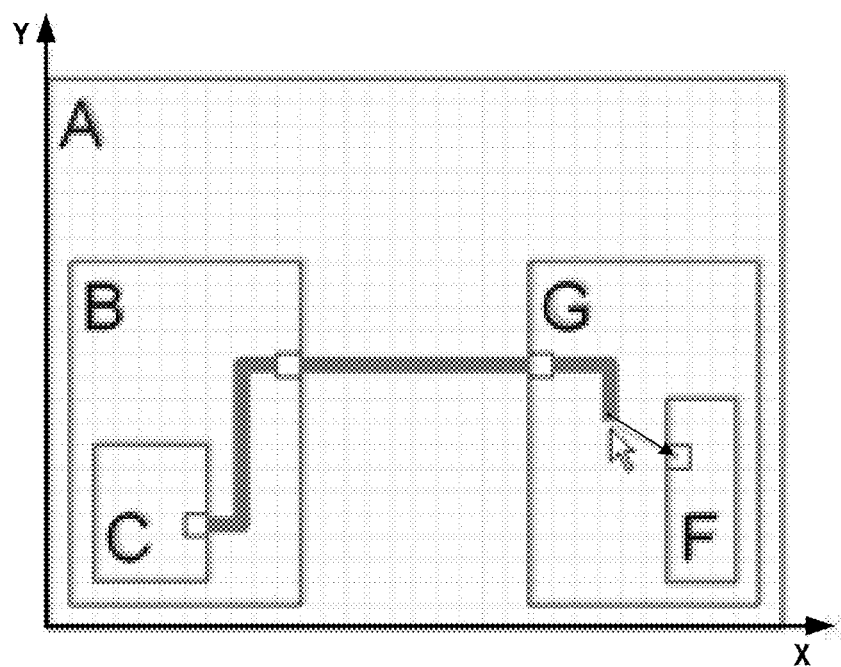
Figure 4D:
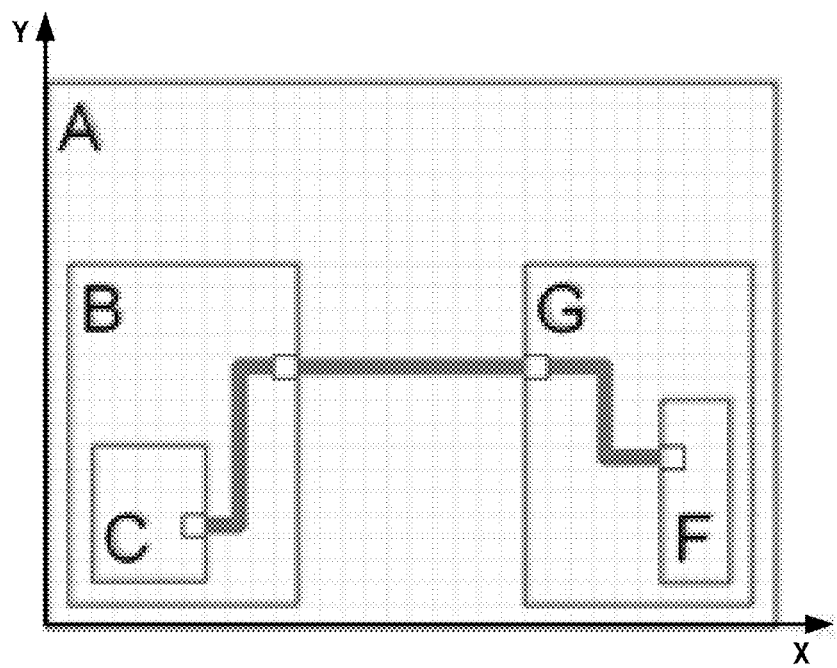

Upon completion of the top level routing, the user can continue routing within block "G" as depicted in FIG. 4C. As explained above, the appropriate context is automatically selected so that the routes are created at the block "G" level and associated with a logical net connecting the pin of block "G" with the pin of object "F." As shown in FIG. 4C, an open flyline from the tip of the route created so far to nearest unconnected pin in object "F" can be used to indicate the direction where the route should go. In FIG. 4D, the physical connections from object "C" in block "B" to object "F" in block "G" is complete. As explained above, the actual routes were created at three hierarchy levels, and they correspond to the logical connections that were illustrated in FIGS. 3A-3B.

Figure 4E:
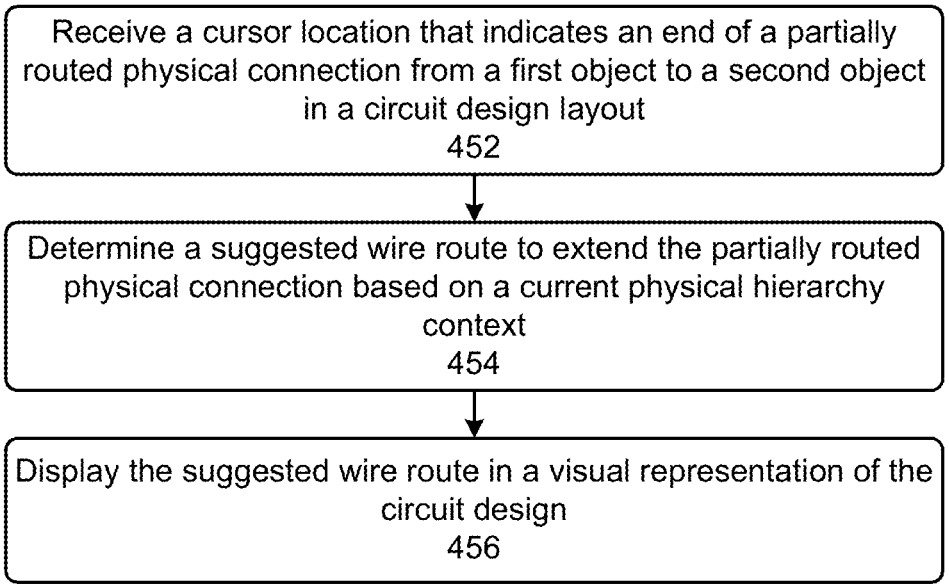
FIG. 4E illustrates a process for facilitating cross hierarchical routing in accordance with some embodiments described herein.

FIG. 4E illustrates a process for facilitating cross hierarchical routing in accordance with some embodiments described herein. The process can begin by receiving a cursor location that indicates an end of a partially routed physical connection from a first object to a second object in a circuit design layout (operation 452). For example, in FIG. 4A, cursor location 402 indicates the end of partially routed physical connection that is represented by thick line 404. Next, the process can determine a suggested route to extend a partially routed physical connection based on a current physical hierarchy context (operation 454). For example, in FIG. 4A, the process can determine open flyline 408 which is a suggested route to extend a partially routed physical connection based on a current physical hierarchy context. The process can then display the suggested route in a visual representation of the circuit design (operation 456), e.g., the process can display open flyline 408 in a visual representation of the circuit design as shown in FIG. 4A.

Transparent Hierarchical Routing

Some embodiments feature another approach for creating physical connections, which is referred to as transparent hierarchical routing. In this approach, an embodiment can begin by analyzing the logical netlist to find endpoints for the connectivity of the net as depicted in FIGS. 3A-3B (as noted above, this process is referred to as tracing). While tracing the logical connection, the connection may cross physical hierarchies and/or cross gates (e.g., buffers, level shifters, etc.) that do not change the logical value of the signal. At the end of the tracing process, the embodiments has a set of points that need to be connected by the physical route and the points to be skipped. In other words, the embodiments essentially determines a new "transparent net" that will be used as the net to be routed. For example, by analyzing the circuit design shown in FIG. 3B, an embodiment can determine transparent net 308 that logically connects the pins on objects "C" and "F" within the top level context of design "A."

Next, the transparent hierarchical routing process can create routing shapes to physically connect the terminal points that were determined in the previous step. The created shapes can be "owned" by the level in the physical hierarchy that is common to all parts of the transparent net that was connected. In many cases, the common level will be the top level in the design.

The embodiments can then automatically transform the routing shapes from the transparent net by transforming the transparent net objects to properly consume the route that has been generated. Specifically, the automatic transformation can include the following operations: (1) move transparent gates to be along the routes, (2) create physical pins on physical hierarchies traversed transparently, and (3) partition the routing objects to be assigned to appropriate nets in the proper physical scopes.

In the life cycle of integrated circuit physical design, the circuit design goes through different stages. At some stages of the design, the block pin shapes could be either undefined or placed sub-optimally for physical routing. As a result of sub optimal pin placement, the route may take an unnecessary detour as depicted in FIG. 4D. Note that the physical connection from the pin in object "C" to the pin in object "F" goes higher up along the right edge of block "B" than it needs to, which creates an unnecessary detour for the route. This issue can be fixed, as explained below, by the using transparent hierarchical routing.

Figure 5A:
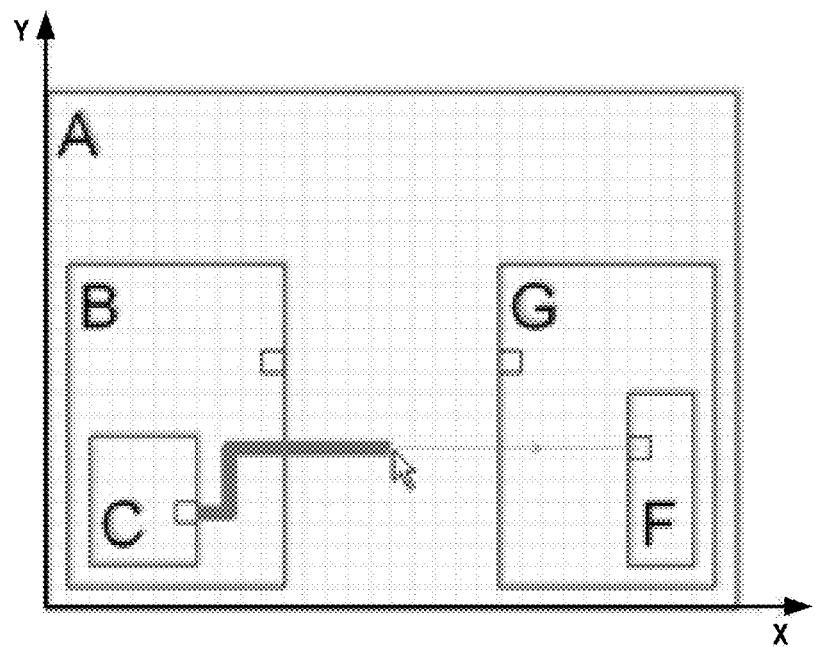
Figure 5B:
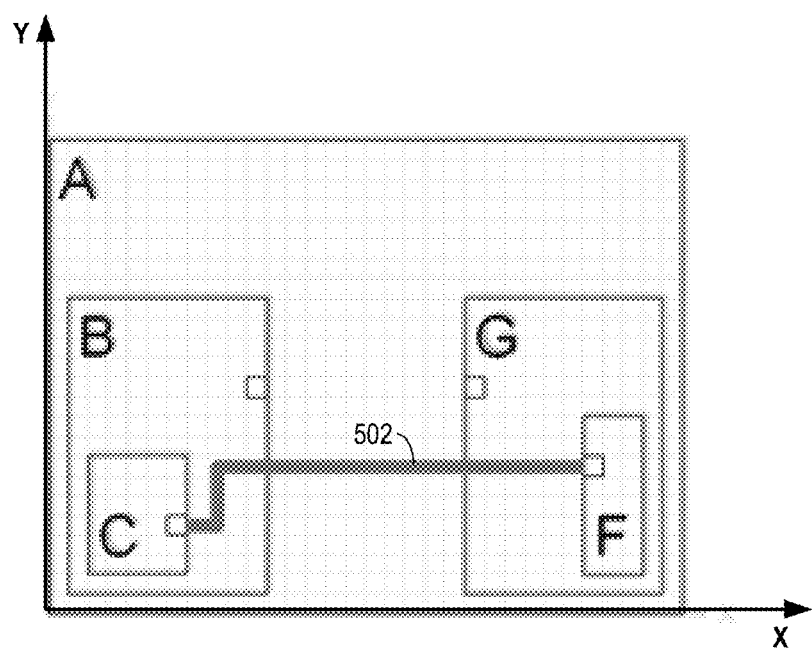

FIGS. 5A-5C illustrate transparent hierarchical routing in accordance with some embodiments described herein. As shown in FIG. 5A, the starting point for routing can be chosen using the same approach as described above. Applying the results of tracing the netlist, the routes can be created between objects "C" and "F" by directly skipping block pins of blocks "B" and "G." The resulting situation is shown in FIG. 5B. At this point, all created routes are associated with the top level net of design "A." In FIG. 5B, the net which was created based on tracing the netlist logically connects blocks "B" and "G." However, note that the physical connection 502 illustrated in FIG. 5B is invalid from a logical standpoint. This physical connection represents an intermediate state of the design. The physical connection will be corrected as explained below to result in the final physical connection that will be valid.

Next, the top level routing can be pushed down the hierarchy as shown in FIG. 5C. Specifically, this step can involve: (1) cutting the top level routing (i.e., physical connection 502) at the intersections with block "B" and "G" boundaries, (2) placing pins 504 and 506 for blocks "B" and "G," respectively, at the intersection points, (3) moving routes that overlap blocks "B" and "G" boundaries from the top level design "A" into blocks "B" and "G," respectively, and (4) associating the moved routes with the corresponding nets of blocks "B" and "G." Upon completion of the above-described push down process, the physical connections 508, 510, and 512 match the corresponding logical connections. Moreover, note that this process has resulted in an optimal connection in terms of length, which reduces signal delays and increases the overall speed of the integrated circuit. Specifically, note that the total length of the physical connection between objects "C" and "F" in FIG. 5C is less than the total length of the physical connection between objects "C" and "F" in FIG. 4D.

FIG. 5D illustrates a process for transparent hierarchical routing in accordance with some embodiments described herein. The process can begin by tracing a logical connection from a first circuit object to a second circuit object in the circuit design, wherein the logical connection passes through at least one physical hierarchy boundary (operation 552). Next, the process can create a physical connection corresponding to the logical connection in a physical hierarchy context that is common to both the first circuit object and the second circuit object (operation 554). For example, the process can create physical connection 502 illustrated in FIG. 5B. The process can then push down the physical connection into physical hierarchy levels along the physical connection route (operation 556). Pushing down the physical connection into physical hierarchy levels along the physical connection route can comprise (1) moving transparent gates to be along the physical connection route, (2) creating physical pins on physical hierarchy block boundaries along the physical connection route, (3) partitioning the physical connection at the physical hierarchy boundaries to obtain routing objects, and (4) assigning each routing object to a corresponding net in each physical hierarchy along the physical connection route. For example, as shown in FIG. 5C, the process can push down physical connection 502 along the route of physical connections 508, 510, and 512 to obtain (1) pins 504 and 506 and (2) physical connections 508, 510, and 512 that match the corresponding logical connections (or nets) in the respective physical hierarchy contexts.

Maintaining Physical Connectivity Across Hierarchy Boundaries

Figure 6A:
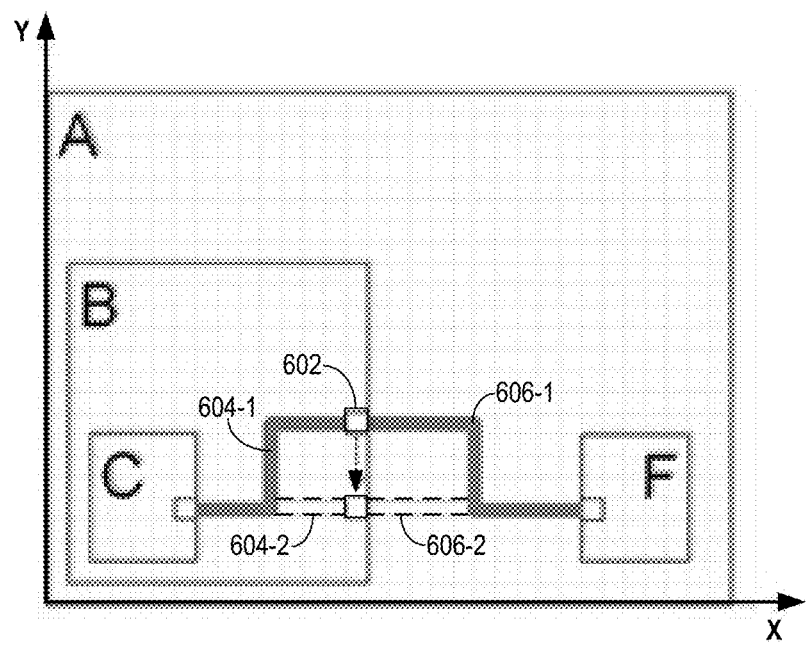
FIG. 6A illustrates how physical connectivity can be maintained across multiple hierarchies in accordance with some embodiments described herein.

Maintaining physical connectivity while editing is a key productivity aid. However, this capability is contained within a scope of single block in conventional tools and is not available across multiple hierarchies. Some embodiments described herein maintain physical connectivity on a per-instance basis, thereby allowing objects that are physically connected at other scopes to also have their connectivity maintained. FIG. 6A illustrates how physical connectivity can be maintained across multiple hierarchies in accordance with some embodiments described herein. In FIG. 6A, pin 602 of block "B" is moved down along the edge of block "B" to a new location, and responsive to this pin movement all connected routes inside and outside block "B" are moved correspondingly. Specifically, inner route 604-1 is moved to obtain new inner route 604-2, and outer route 606-1 is moved to obtain new outer route 606-2. Note that inner route 604-1 is in the context of block "B," whereas outer route 606-1 is in the context of top level design "A."

Figure 6B:
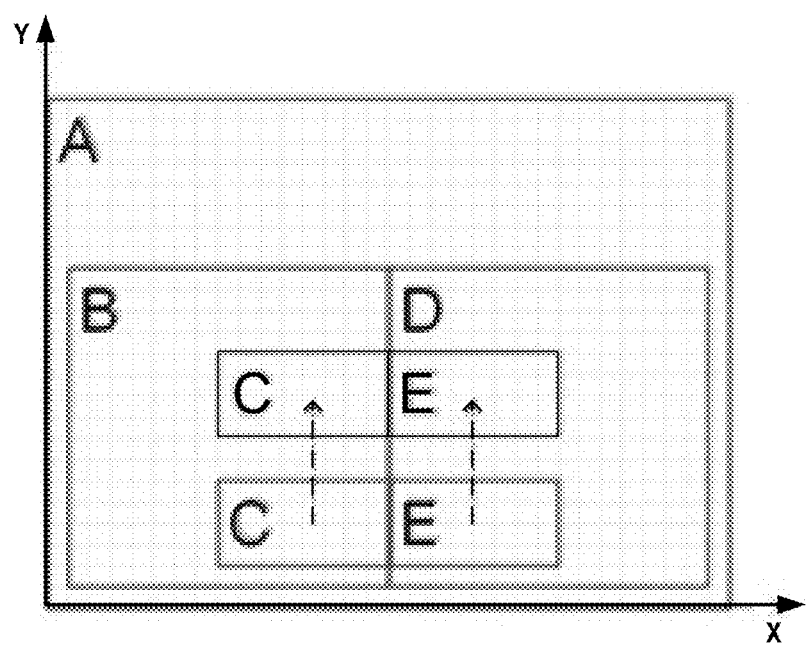
FIG. 6B illustrates how abutted objects can be moved together in accordance with some embodiments described herein.

In integrated circuit physical design, in order to achieve higher degree of integration and fastest signal delivery, often the elements are placed next to each other so that their shapes become abutted. In an abutted design, the routing between pins of abutted blocks is not needed (e.g., because the abutted blocks share a boundary). However, it is important to maintain the abutted status of objects when one of the objects is moved. In the case when two abutted objects belong to two different hierarchies, such maintenance is difficult and is typically not supported by conventional tools (i.e., the user may need to manually edit objects in the different hierarchies to ensure that the two objects remain abutted). In contrast to conventional tools, some embodiments described herein can automatically ensure that abutted objects remain abutted when one of them is moved. FIG. 6B illustrates how abutted objects can be moved together in accordance with some embodiments described herein. Object "C" is in block "B" and object "E" is in block "D." Note that objects "C" and "E" are abutting each other, and they are in different physical hierarchies. However, when object "C" is moved up within block "B," some embodiments can automatically move object "E" up in block "D."

Figure 6C:
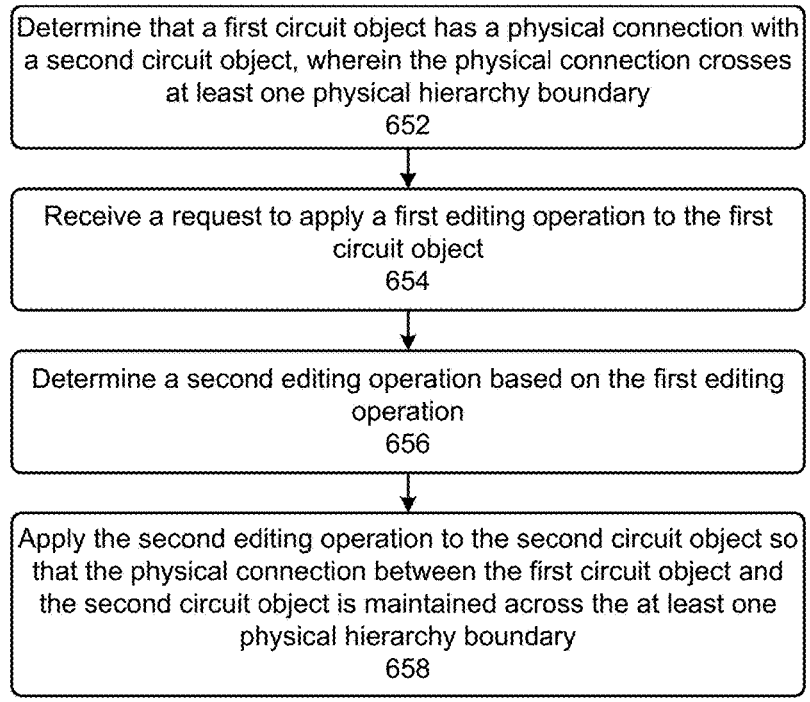
FIG. 6C illustrates a process for maintaining physical connectivity across hierarchical boundaries in accordance with some embodiments described herein.

FIG. 6C illustrates a process for maintaining physical connectivity across hierarchical boundaries in accordance with some embodiments described herein. The process can begin by determining that a first circuit object has a physical connection with a second circuit object, wherein the physical connection crosses at least one physical hierarchy boundary (operation 652). Next, the process can receive a request to apply a first editing operation to the first circuit object (operation 654). The process can then determine a second editing operation based on the first editing operation (operation 656). Next, the process can apply the second editing operation to the second circuit object so that the physical connection between the first circuit object and the second circuit object is maintained across the at least one physical hierarchy boundary (operation 658).

Figure 7:
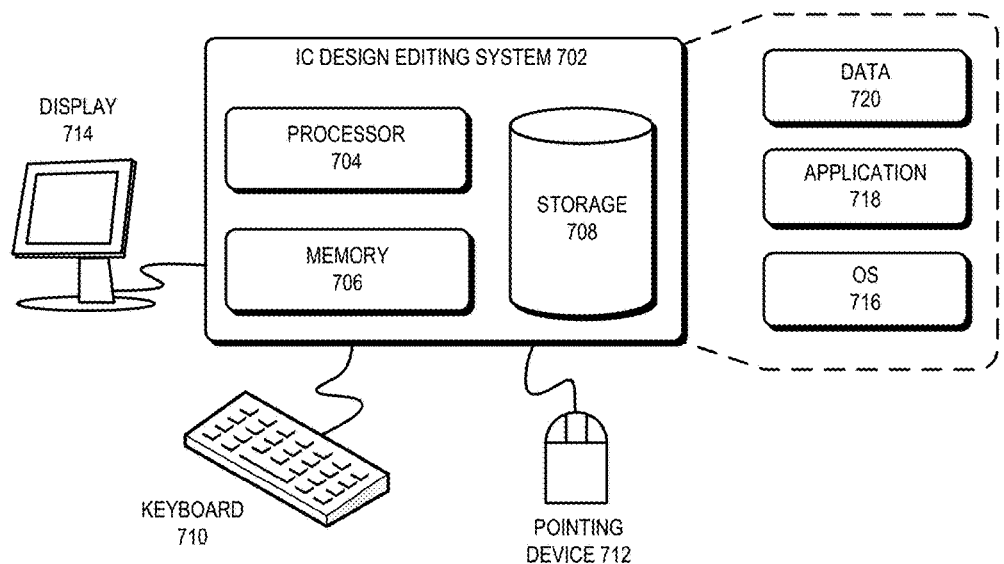
FIG. 7 illustrates an IC design editing system in accordance with some embodiments described herein.

The term "IC design editing system" generally refers to a hardware based system that facilitates editing of IC designs, and in particular that facilitates transparent editing of physical data in hierarchical IC designs. FIG. 7 illustrates an IC design editing system in accordance with some embodiments described herein. IC design editing system 702 can include processor 704, memory 706, and storage device 708. Specifically, memory locations in memory 706 can be addressable by processor 704, thereby enabling processor 704 to access (e.g., via load/store instructions) and manipulate (e.g., via logical/floating point/arithmetic instructions) the data stored in memory 706. IC design editing system 702 can be coupled to display device 714, keyboard 710, and pointing device 712. Storage device 708 can store operating system 716, IC design editing software tool 718, and data 720. Data 720 can include input required by IC design editing software tool 718 and/or output generated by IC design editing software tool 718.

IC design editing system 702 may automatically (or with user help) perform one or more operations that are implicitly or explicitly described in this disclosure. Specifically, IC design editing system 702 can load IC design editing software tool 718 into memory 706, and IC design editing software tool 718 can then be used to transparently edit physical data in hierarchical IC designs.

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a computer-readable storage medium or device, so that when a computer system reads and executes the code and/or data, the computer system performs the associated methods and processes. The methods and processes can also be partially or fully embodied in hardware modules or apparatuses, so that when the hardware modules or apparatuses are activated, they perform the associated methods and processes. Note that the methods and processes can be embodied using a combination of code, data, and hardware modules or apparatuses.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A non-transitory computer-readable storage medium storing instructions for a circuit design tool that, when executed by a computer, cause the computer to perform a method for editing objects in a circuit design, the method comprising:

the computer creating a data structure for temporarily storing and editing objects in a memory of the computer;

the computer creating a second object in the data structure based on a first object in the circuit design, wherein the first object is represented in a first coordinate system associated with a lower level in the physical hierarchy, wherein the second object is represented in a second coordinate system associated with a top level in the physical hierarchy, wherein said creating comprises automatically applying a sequence of one or more geometric transformations to the first object to transform a representation of the first object from the first coordinate system to the second coordinate system;

the computer applying one or more edits to the second object, thereby obtaining an edited second object that is stored in the data structure and is represented in the second coordinate system;

the computer automatically applying the sequence of one or more geometric transformations in reverse order to the edited second object, thereby obtaining an edited first object; and the computer saving the edited first object in the circuit design.

2. The non-transitory computer-readable storage medium of claim 1, wherein applying one or more edits to the second object includes moving the second object to a new location.

3. The non-transitory computer-readable storage medium of claim 1, wherein applying one or more edits to the second object includes rotating the second object.

4. The non-transitory computer-readable storage medium of claim 1, wherein applying one or more edits to the second object includes resizing the second object.

5. The non-transitory computer-readable storage medium of claim 1, wherein applying one or more edits to the second object includes creating a new object within the second object.

6. A method for editing objects in a circuit design, the method comprising:

a processor of a computer creating a data structure for temporarily storing and editing objects in a memory of the computer;

the processor creating a second object in the data structure based on a first object in the circuit design, wherein the first object is represented in a first coordinate system associated with a lower level in the physical hierarchy, wherein the second object is represented in a second coordinate system associated with a top level in the physical hierarchy, wherein said creating comprises automatically applying a sequence of one or more geometric transformations to the first object to transform a representation of the first object from the first coordinate system to the second coordinate system;

the processor applying one or more edits to the second object, thereby obtaining an edited second object that is stored in the data structure and is represented in the second coordinate system;

the processor automatically applying the sequence of one or more geometric transformations in reverse order to the edited second object, thereby obtaining an edited first object; and the processor saving the edited first object in the circuit design.

7. The method of claim 6, wherein applying one or more edits to the second object includes moving the second object to a new location.

8. The method of claim 6, wherein applying one or more edits to the second object includes rotating the second object.

9. The method of claim 6, wherein applying one or more edits to the second object includes resizing the second object.

10. The method of claim 6, wherein applying one or more edits to the second object includes creating a new object within the second object.

11. An IC design editing system, comprising:
a processor; and
a non-transitory computer-readable storage medium storing instructions that, when executed by the processor, cause the IC design editing system to perform a method for editing objects in a circuit design, the method comprising:

creating a data structure for temporarily storing and editing objects in a memory of the computer;

creating a second object in the data structure based on a first object in the circuit design, wherein the first object is represented in a first coordinate system associated with a lower level in the physical hierarchy, wherein the second object is represented in a second coordinate system associated with a top level in the physical hierarchy, wherein said creating comprises automatically applying a sequence of one or more geometric transformations to the first object to transform a representation of the first object from the first coordinate system to the second coordinate system;

applying one or more edits to the second object, thereby obtaining an edited second object that is stored in the data structure and is represented in the second coordinate system;

automatically applying the sequence of one or more geometric transformations in reverse order to the edited second object, thereby obtaining an edited first object; and saving the edited first object in the circuit design.

12. The IC design editing system of claim 11, wherein applying one or more edits to the second object includes moving the second object to a new location.

13. The IC design editing system of claim 11, wherein applying one or more edits to the second object includes rotating the second object.

14. The IC design editing system of claim 11, wherein applying one or more edits to the second object includes resizing the second object.

15. The IC design editing system of claim 11, wherein applying one or more edits to the second object includes creating a new object within the second object.

* * * * *